United States Patent [19]

Katsui

[11] Patent Number: 5,559,674

[45] Date of Patent: Sep. 24, 1996

[54] HEAT SINK AND MOUNTING STRUCTURE FOR HEAT SINK

[75] Inventor: Tadashi Katsui, Kawasaki, Japan

[73] Assignee: Fujitsu Limited, Japan

[21] Appl. No.: 568,396

[22] Filed: Dec. 15, 1995

Related U.S. Application Data

[63] Continuation of Ser. No. 214,702, Mar. 18, 1994, abandoned.

[30] Foreign Application Priority Data

| Mar. 19, 1993 | [JP] | Japan | 5-060004 |
| Sep. 10, 1993 | [JP] | Japan | 5-225650 |
| Feb. 25, 1994 | [JP] | Japan | 6-028413 |

[51] Int. Cl.⁶ ............................................. H05K 7/20
[52] U.S. Cl. .................. 361/697; 165/80.3; 165/121; 174/16.3
[58] Field of Search ................................ 165/80.3, 122, 165/124, 125, 126; 174/16.3; 257/718–719, 722, 726–727; 310/62–64, 67 R, 71; 361/694–697; 415/175–178, 213.1, 214.1, 220

[56] References Cited

U.S. PATENT DOCUMENTS

| 4,164,003 | 8/1979 | Cutchaw . | |
| 4,345,267 | 8/1982 | Corman et al. . | |
| 4,716,494 | 12/1987 | Bright et al. . | |
| 5,019,940 | 5/1991 | Clemens . | |
| 5,288,203 | 2/1994 | Thomas | 415/178 |
| 5,299,632 | 4/1994 | Lee | 361/697 |
| 5,309,983 | 5/1994 | Bailey | 361/697 |
| 5,335,722 | 8/1994 | Wu | 361/697 |
| 5,430,611 | 7/1995 | Patel et al. | 361/697 |

FOREIGN PATENT DOCUMENTS

| 0499150 | 10/1991 | European Pat. Off. . |
| 0572326 | 12/1993 | European Pat. Off. . |
| 2316737 | 1/1977 | France . |
| 3335377 | 4/1985 | Germany . |
| 8761007 | 2/1989 | Germany . |
| 03124007 | 5/1991 | Japan . |
| 2267601 | 12/1993 | United Kingdom . |
| WO-A-8900751 | 1/1989 | WIPO . |

OTHER PUBLICATIONS

Research Disclosure, No. 318, Oct. 1990, Havant GB, p. 851 'Spring–Loaded Heat Sinks for VLSI Packages'.

*Primary Examiner*—Gregory D. Thompson
*Attorney, Agent, or Firm*—Staas & Halsey

[57] ABSTRACT

A structure for mounting a heat sink onto an integrated circuit package mounted on a printed circuit board is constructed such that a guide member having a frame portion and support post portions is fixed to the printed circuit board, and the heat sink is seated on an inner periphery of the guide member such that the heat sink may closely contact the integrated circuit package. A cover is fixed to the guide member such that it covers outer peripheral edge portions of an upper face of the heat sink. This structure is high in cooling efficiency and is easy to mount.

4 Claims, 16 Drawing Sheets

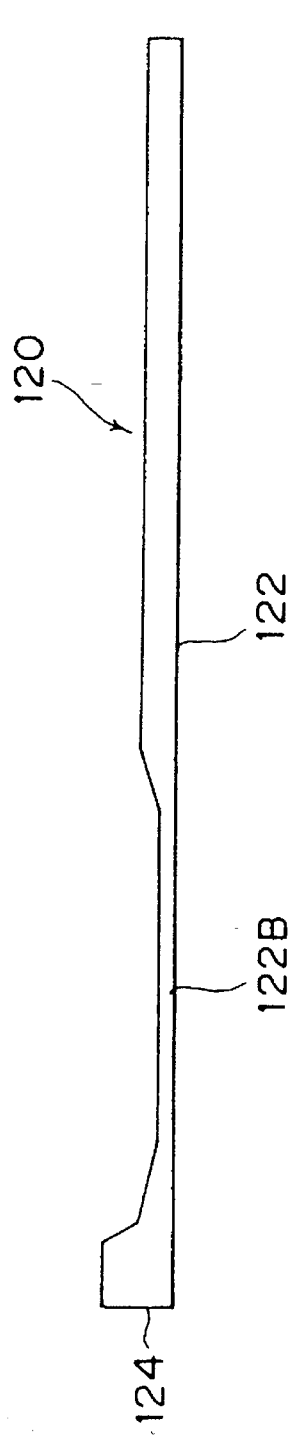
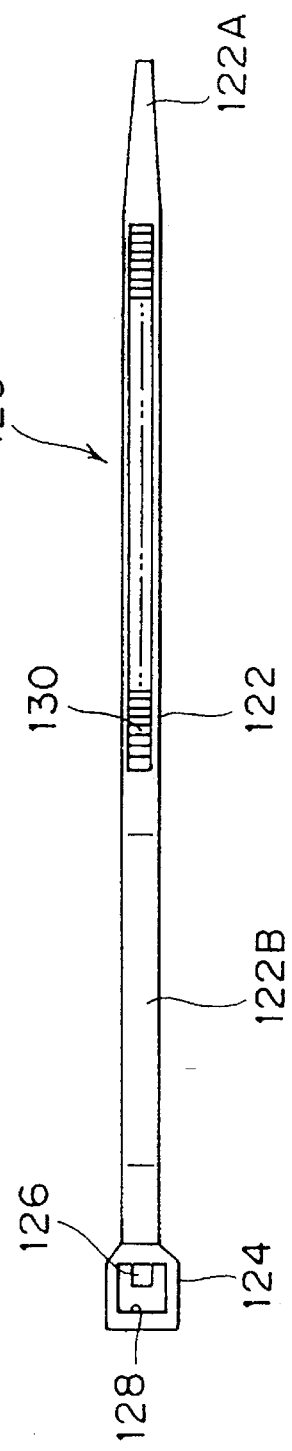

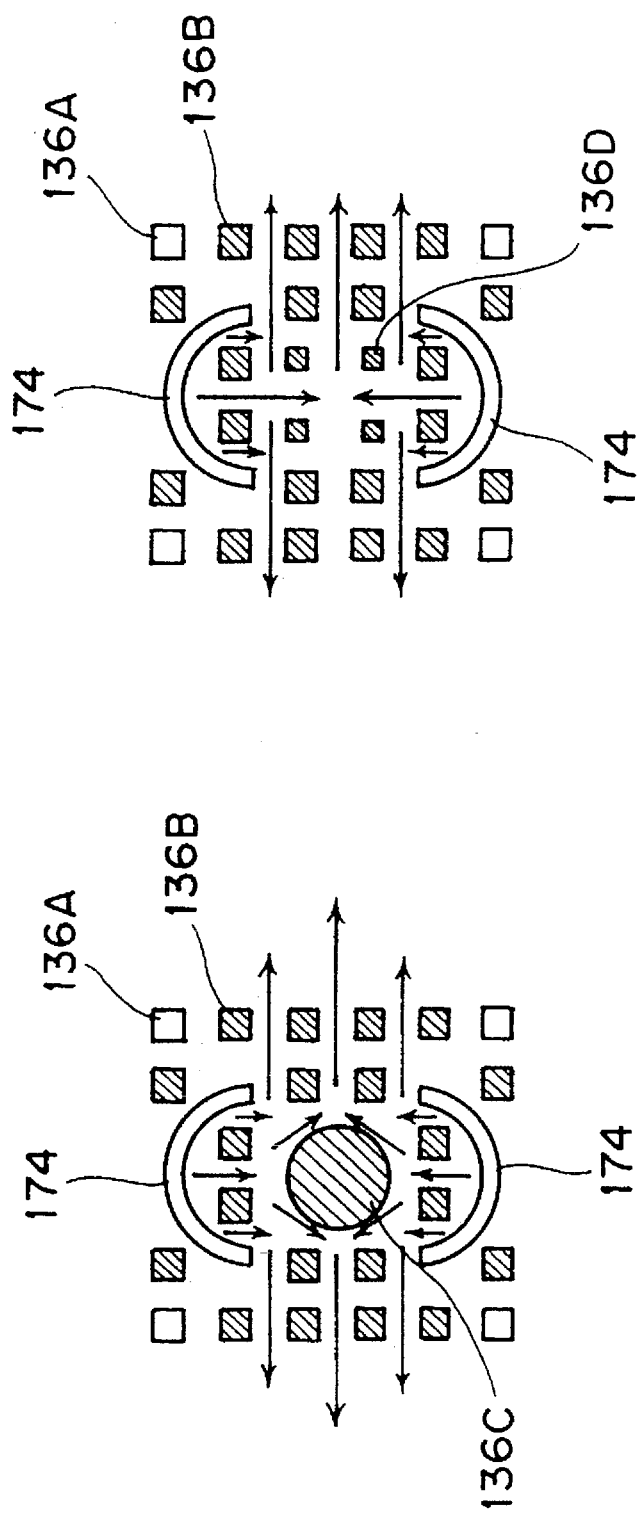

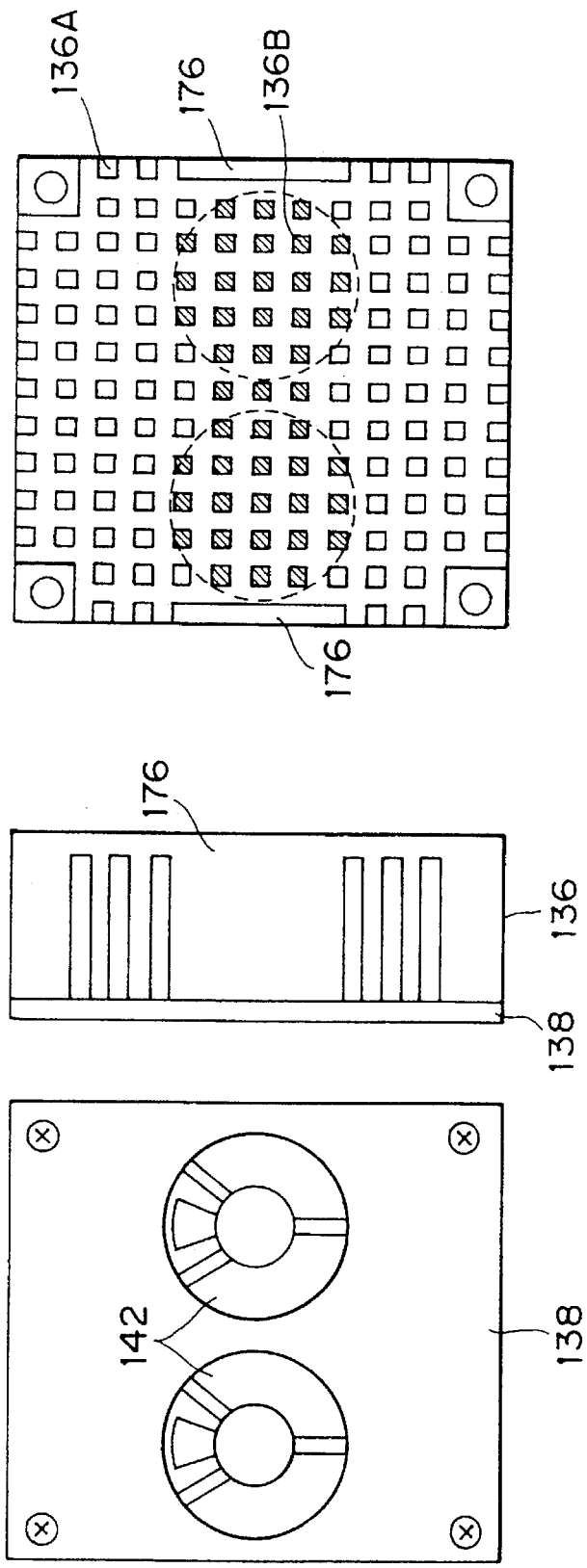

HEAT SINK AND MOUNTING STRUCTURE FOR HEAT SINK

This application is a continuation of application Ser. No. 08/214,702, filed Mar. 18, 1994, now abandoned.

BACKGROUND OF THE INVENTION

1. Field of the Invention

This invention relates to a mounting structure for a heat sink onto an integrated circuit package mounted on a printed circuit board.

2. Description of the Related Art

In recent years, portable electronic apparatus such as, for example, lap-top personal computers, appear widely on the market as electronic apparatus for which miniaturization and high reliability are required. In order to achieve a high performance of electronic apparatus of the type mentioned, it is necessary to use one or more integrated circuit packages having a great amount of heat generation. Therefore, in order to assure a heat radiation property of an integrated circuit package having a great amount of heat generation, a heat sink is used when an integrated circuit package is to be mounted onto a printed circuit board. A heat sink is required to be mounted such that it closely contacts, with certainty, a heat radiation face of an integrated circuit package in order to prevent an increase of the heat resistance by contact, to optimize the mounting structure for a heat sink onto an integrated circuit package.

FIG. 17A is a top plan view of a conventional mounting structure for a heat sink onto an integrated circuit package, and FIG. 17B is a side elevational view of the same. In the present conventional example, an integrated circuit package 101 is mounted in a little floating condition on a printed circuit board 103 by soldering pins 102 of the integrated circuit package 101 to a conductor pattern (not shown) of the printed circuit board 103, while depressions 106 are provided at upper face edge portions of a heat sink 105 having heat radiation fins 104, and the heat sink 105 and the integrated circuit package 101 are held at the depressions 106 of the sink 105 and lower face edge portions of the integrated circuit package 101 by clips 107 having a substantially C-shaped section and made of a resin or the like (refer to, for example, U.S. Pat. No. 5,099,550).

FIG. 18A is a top plan view of another conventional mounting structure for a heat sink onto an integrated circuit package, and FIG. 18B is a side elevational view of the same. In the present conventional example, pins 112 of an integrated circuit package 111 are mounted on a printed circuit board 114 by way of a frame 113 made of an insulator such as a resin. The frame 113, having a substantially rectangular shape as viewed in plan, has a pair of projections 115 which project sidewardly at locations in the proximity of a diagonal line of an upper face thereof. A heat sink 117 having heat radiation fins 116 at an upper portion thereof is placed on an upper face of the integrated circuit chip 111, and a clip 118 formed from a metal wire shaped in a crank shape is disposed on the heat sink 117 while the opposite ends of the clip 118 are engaged with the projections 115 of the frame 113 so that the heat sink 117 is fixed relative to the integrated circuit package 111 (refer to Japanese Patent Laid-Open Application No. Showa 63-133557 or U.S. Pat. No. 4,745,456).

In the conventional example described with reference to FIGS. 17A and 17B, since the upper face edge portions of the heat radiation fin 105 are held by means of the clips 107 having a C-shaped section, it is necessary to provide the depressions 105 of a comparatively large size at the edge portions, and there is a problem in that the heat radiation area of the heat sink 105 is decreased and the cooling efficiency is deteriorated.

Meanwhile, in the conventional example described with reference to FIGS. 18A and 18B, since it is necessary to interpose, already at the stage when the integrated circuit package 111 is to be mounted onto the printed circuit board 114, the frame 113 between the integrated circuit package 111 and the printed circuit board 114, there is a problem in that the manufacturing operability is low. Further, when the frame 113 made of a resin or the like is broken, for example, at a portion of a projection 115, it is difficult to exchange the frame 113, and the heat sink 117 can no longer be mounted.

SUMMARY OF THE INVENTION

Accordingly, it is an object of the present invention to provide a mounting structure for a heat sink which is high in cooling efficiency and is easy to mount.

It is another object of the present invention to provide a heat sink having a high cool efficiency.

According to the present invention, there is provided a mounting structure for a heat sink for mounting a heat sink onto an integrated circuit package mounted on a printed circuit board, which is constructed such that a guide member having a frame portion corresponding to an outer periphery of the integrated circuit package and support post portions protruding from the frame portion is fixed to the printed circuit board, that the heat sink is seated on an inner periphery of the guide member such that a lower face of the heat sink is closely contacted with an upper face of the integrated circuit package, and that a cover is fixed to the guide member at the support post portions such that it covers over outer peripheral edge portions of an upper face of the heat sink.

According to a preferred embodiment of the present invention, when the outer periphery of the integrated circuit packet is substantially equal to the inner periphery of the frame portion of the guide member, for example, the support post portions of the guide member have a profile wherein they protrude in upward and downward directions of the guide member and lower faces of the support post portions are fixed directly to the printed circuit board.

According to another preferred embodiment of the present invention, when the outer periphery of the integrated circuit package is substantially equal to the outer periphery of the frame portion of the guide member, for example, the support post portions of the guide member have a shape wherein they protrude only in the upward direction of the guide member and the guide member is adhered at a bottom face thereof to the integrated circuit package so that the guide member is fixed to the printed circuit board.

According to another aspect of the present invention, there is provided a mounting structure for a heat sink, which comprises a printed circuit board, an integrated circuit package mounted on the printed circuit board, a heat sink placed on the integrated circuit package, and a belt member provided around the integrated circuit package and the heat sink through a gap between the printed circuit board and the integrated circuit package for pressing the heat sink against the integrated circuit package.

According to a further aspect of the present invention, there is provided a heat sink, which comprises a base member having a lower face closely contacted with an upper face of an integrated circuit package and an upper face from which a plurality of heat radiation fins extend, a cover secured to the base member for closing an upper portion of the base member, and air blasting means provided on the cover for performing circulation of air by way of the fins, those of the plurality of fins at a portion corresponding to the air blasting means being shorter than the fins at the other portion.

In the present invention, since the heat sink is mounted on the integrated circuit package using the guide member and the cover of the particular constructions, a high cooling efficiency can be obtained and mounting of the heat sink is facilitated.

When the present invention is put into practice, the cooling efficiency can be further enhanced by constructing the heat sink so that it has a base member having heat radiation fins and air blasting means for forcibly cooling the base member by air cooling.

Further, by putting the present invention into practice using a cover made of a resilient plate member having a shape curved toward the heat sink side, the heat sink can always be closely contacted with the integrated circuit package irrespective of a dispersion and so forth in mounting height of the integrated circuit package, and accordingly, it is possible to maintain a high cooling efficiency.

The above and other objects, features and advantages of the present invention and the manner of realizing them will become more apparent, and the invention itself will best be understood from a study of the following description and appended claims with reference to the attached drawings showing some preferred embodiments of the invention.

BRIEF DESCRIPTION OF THE DRAWINGS

FIGS. 9A and 9B are a side elevational view and a plan view showing an example of a belt member shown in FIG. 8;

FIGS. 15A and 15B are views showing another example of an arrangement of fins;

FIGS. 16A, 16B and 16C are views showing a second embodiment of the heat sink of the present invention;

DESCRIPTION OF THE PREFERRED EMBODIMENTS

Preferred embodiments of the present invention will be described in detail below with reference to the accompanying drawings.

Figure 1:
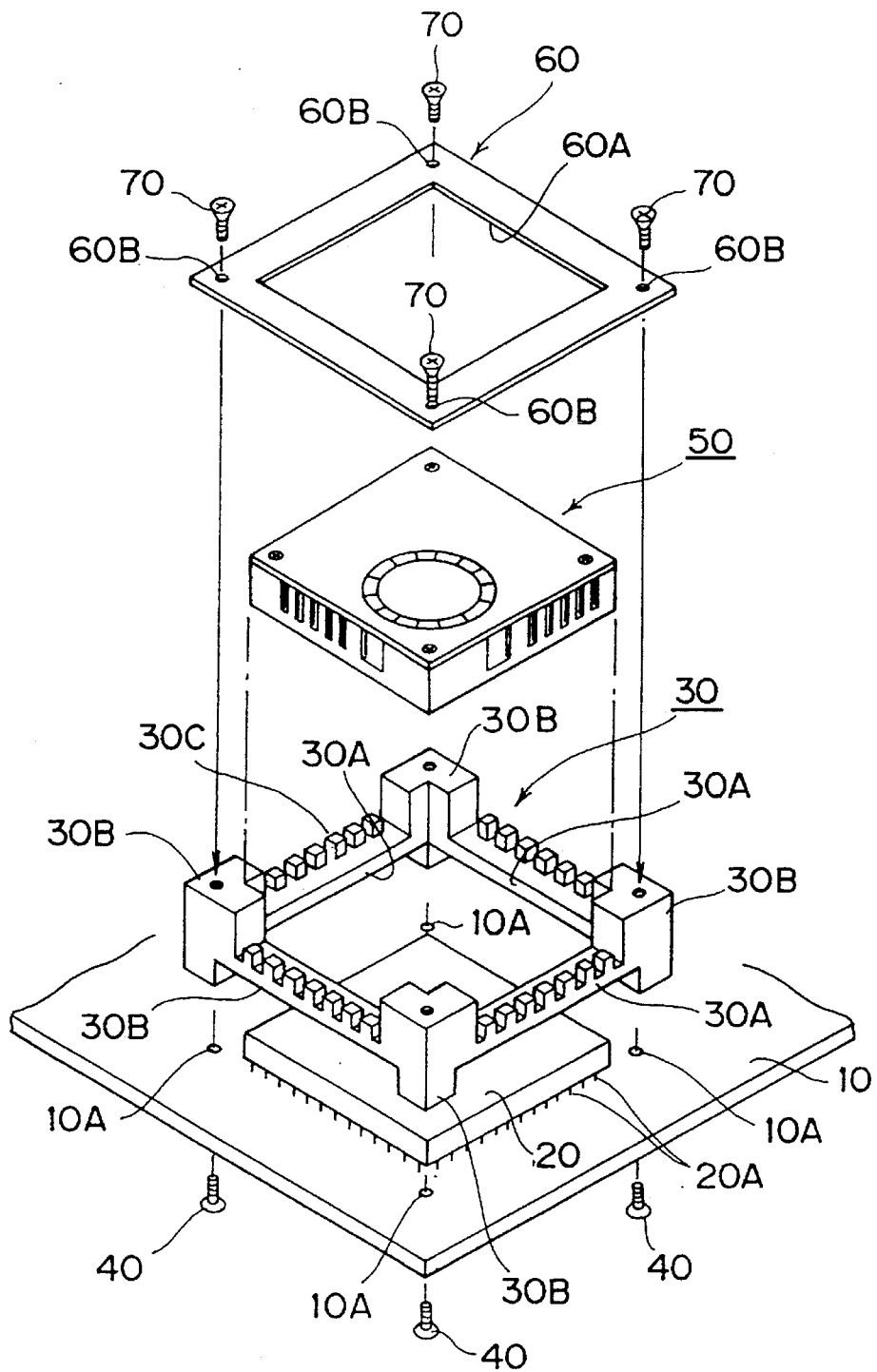
FIG. 1 is an exploded perspective view of a mounting structure for a heat sink showing a first embodiment of the present invention.

FIG. 1 is an exploded perspective view of a mounting structure for a heat sink showing a first embodiment of the present invention. An integrated circuit package 20 mounted on a printed circuit board 10 has a plurality of pins 20A for electric connection, and the pins 20A are connected by soldering to a conductor pattern (not shown) formed on a front or rear face of the printed circuit board 10. A guide member 30, made of a material having a high heat conductivity, such as aluminum, has a frame portion 30A having an inner periphery substantially equal to an outer periphery of the integrated circuit package 20, support post portions 30B protruding in upward and downward directions at the four corners of the frame portion 30A, and a plurality of fin portions 30C protruding in the upward direction from the frame portion 30A. The frame portion 30A, support post portions 30B and fin portions 30C are formed, for example, as a unitary member.

In the present embodiment, the guide member 30 is disposed around the periphery of the integrated circuit package 20 on the printed circuit board 10, and the support post portions 30B are fixed directly to the printed circuit board 10. In the example shown, screws 40 are individually screwed into the four support post portions 30B of the guide member 30 from the rear face side of the printed circuit board 10 through four threaded holes 10A formed in the printed circuit board 10 so that the guide member 30 is fixed to the printed circuit board 10. The guide member 30 may be fixed to the printed circuit board 10 by adhering the support post portions 30B to the upper face of the printed circuit board 10. The heat sink 50 is seated on the inner periphery of the guide member 30 such that a lower face thereof may be closely contacted with the upper face of the integrated circuit package 20. In order to reduce the heat resistance between the heat sink 50 and the integrated circuit 20, grease may be interposed between them. A detailed construction of the heat sink 50 will be hereinafter described. A cover 60 has an opening 60A for exposing the upper face of the heat sink 50 and threaded holes 60B, and the cover 60 is fixed to the guide member 30 by screwing screws 70 into the support post portions 30B through threaded holes 60B. The shape of the cover 60 is set such that, when the cover 60 is fixed to the guide member 30, it covers over outer peripheral edge portions of the heat sink 50 to such a degree that it does not deteriorate the heat radiation property of the heat sink 50.

Figure 2:
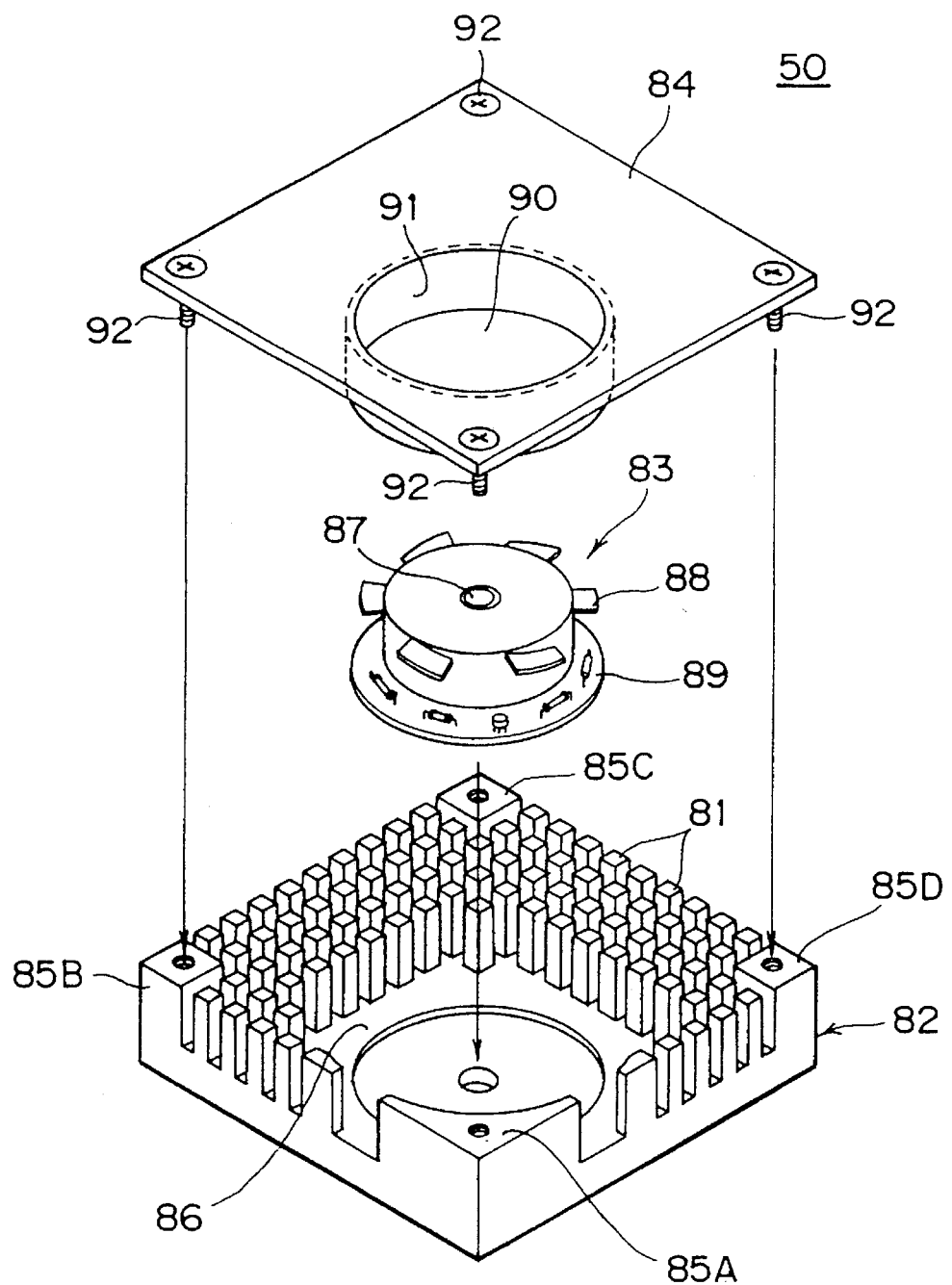
FIG. 2 is an exploded perspective view showing an example of a heat sink suitable for putting the present invention into practice.

FIG. 2 is an exploded perspective view showing an example of a construction of the heat sink 50 of FIG. 1. The heat sink 50 has a base member 82 having heat radiation fins 81 on an upper face thereof, a fan assembly (air blasting device) 83 provided on the upper face of the base member 82 for blasting air to the heat radiation fins 81, and a cover member 84 for covering over an upper portion of the base member 82. The base member 82 and the cover member 84 are formed from a material having a high heat conductivity, such as aluminum, similar to the guide member 30 of FIG. 1, and a lower face of the base member 82 is formed flat in order to reduce the contact heat resistance with an integrated circuit package 20 (refer to FIG. 1). Support posts 85A, 85B, 85C and 85D are provided at the four corners of the upper face of the base member 82, and the heat radiation fins 81 are provided so as to cover over the fan assembly 83 exempt portions at which the support posts are formed. The support posts 85A, 85B, 85C and 85D and the heat radiation fins 81 are formed integrally with a plate-formed portion of the base member 82. A ventilation path 86 is defined between the fan assembly 83 fixed to the base member 82 and the heat radiation fins 81. The fan assembly 83 has a motor (not shown) having a shaft 87 extending substantially perpendicularly to the upper face of the base member 82, blades 88 rotated by the shaft 87, and a printed circuit board 89 having a driver circuit for the motor. The cover member 84 is fixed to the support posts 85A, 85B, 85C and 85D of the base member 82 by means of screws 92. The cover member 84 has an opening 90 which is communicated with the ventilation path 86 by way of the blades 88 of the fan assembly 83, and further has an annular projection 91 positioned a little outwardly of a locus of rotation of the blades 88. Since the annular projection 91 limits the ventilation path 86, the static pressure difference between the opening 90 of the cover 84 and the ventilation path 86 is increased, and efficient blasting of air can be performed. When electric power is supplied to the fan assembly 83 to rotate the blades 88 in a predetermined direction, due to a comparatively great static pressure difference between the outside and the ventilation path 86 which is caused by an action of the annular projection 91, air flows, for example, in a direction from the opening 90 of the cover 84 toward the heat radiation fins 81 of the base member 82. Then, due to the communication of air, good heat radiation is performed at the heat radiation fins 81 and so forth. The inclination angle of the blades 88 may be reversed or the direction of rotation of the fan assembly 83 may be reversed so that air may be caused to flow in the other direction from the heat radiation fins 81 of the base member 82 toward the opening 90 of the cover 84.

In the present example, the fixation location of the fan assembly 83 to the base member 82 is offset in the direction toward 85A of the four support posts 85A, 85B, 85C and 85D, and a wall face of the support post 85A is provided so as to extend in the directions toward the support posts 85B and 85D. The reason why the center of rotation of the fan assembly 83 is displaced from the center (for example, the center of gravity) of the base member 82 is that the air blasting capacity of the fan assembly 83 is higher at a peripheral portion than a central portion thereof, and the location where the air blasting capacity is high and the center (normally a central portion of the package) of heat generation of the integrated circuit package 20 (refer to FIG. 1) are made substantially coincide with each other to achieve effective heat radiation. It is to be noted that the reason why, when the fan assembly 83 is to be offset in such a manner as described above, the wall face of the support post 85A on the side on which the fan assembly 83 is to be offset is caused to extend, is that it is intended so that communication of air to the heat radiation fins 81 may be performed equally. While the fan assembly 83 in the present example is fixed to the base member 82, the fan assembly 83 may be fixed to the cover member 84 so that heat may not be transmitted readily from the integrated circuit board 20 (refer to FIG. 1) to the fan assembly. Consequently, the reliability of the fan assembly 83 is improved.

Figure 18A:
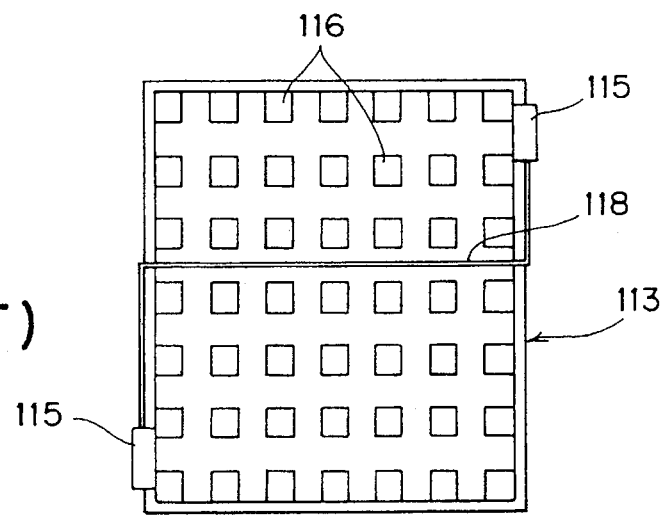
FIGS. 18A and 18B are views showing another example of the conventional mounting structure for a heat sink.
Figure 18B:
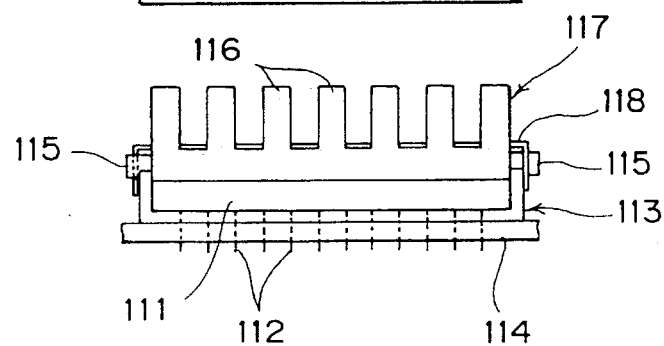

By using such a heat sink having means for forcible air cooling as shown in FIG. 2, heat radiation of the integrated circuit package 20 can be achieved very excellently with the construction of, for example, FIG. 1. Where a heat sink of a high performance of this type is used, it is very important to assure a heat radiation area of the heat sink in order to maintain a high heat radiation characteristic. By mounting the heat sink 50 on the integrated circuit package 20 using the guide member 30 and the cover 60 of the specific forms as in the embodiment of FIG. 1, a high performance of the heat sink 50 can be utilized effectively. Further, since the heat sink 50 can be mounted onto the integrated circuit package 20 after the integrated circuit chip 20 is mounted onto the printed circuit board 10, the mounting operation does not become cumbersome as in the prior art described with reference to FIGS. 18A and 18B. Further, when it is tried to reduce the contact resistance while grease is applied to the lower face of the heat sink 50 and/or the upper face of the integrated circuit chip 20, since the guide member 30 is positioned on the outer periphery of the contact face of the same, grease is prevented from leaking out and the reliability of the apparatus is enhanced.

Figure 3:
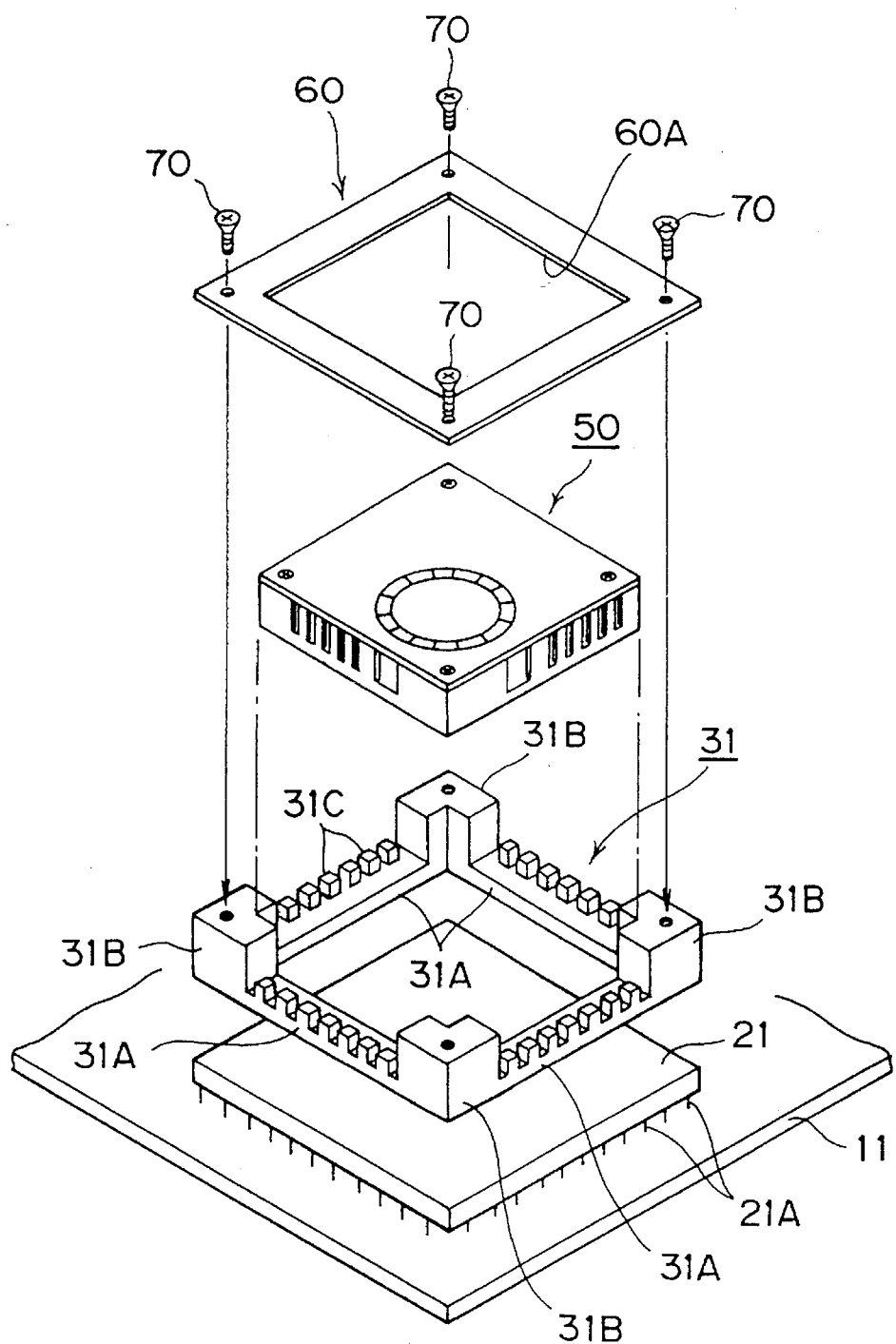
FIG. 3 is an exploded perspective view of a mounting structure for a heat sink showing a second embodiment of the present invention.

FIG. 3 is an exploded perspective view of a mounting structure for a heat sink showing a second embodiment of the present invention. The present embodiment is characterized, in contrast with the first embodiment of FIG. 1, in that the present invention is applied to a comparatively large integrated circuit package 21. The integrated circuit package 21 is mounted at pins 21A thereof onto a printed circuit board 11 in a similar manner as in the first embodiment of FIG. 1. A guide member 31 integrally has a frame member 31A, support post portions 31B and fin portions 31C. The guide member 31 is formed from a material having a high heat conductivity such as aluminum. An outer periphery of the frame portion 31 of the guide member 31 is, in the present embodiment, substantially equal to an outer periphery of the integrated circuit package 21, and the support post portions 31B protrude only in an upward direction of the frame portion 31A. Accordingly, a lower face of the guide member 31 can be fixed readily by adhesion to edge portions of an upper face of the integrated circuit package 21. The heat sink 50 is seated on an inner periphery of the guide member 31 such that a lower face thereof is closely contacted with the upper face of the integrated circuit package 21, and a cover 60 is provided such that it covers over outer peripheral edge portions of an upper face of the heat sink 50. The heat sink 50 and the cover 60 are the same as those in the first embodiment of FIG. 1.

Figure 17A:
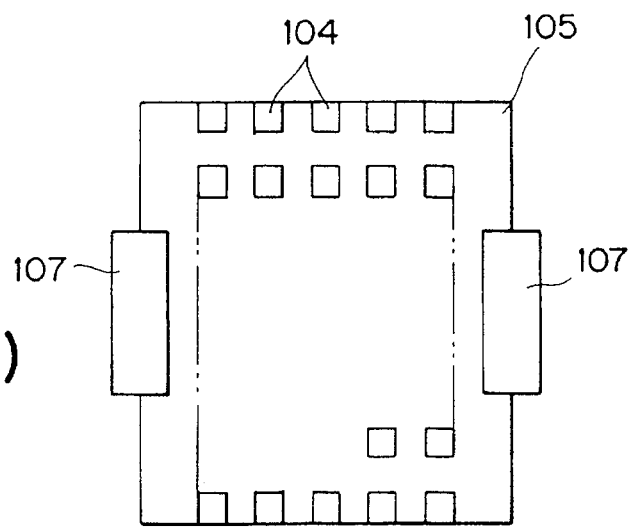
FIGS. 17A and 17B are views showing an example of a conventional mounting structure for a heat sink.
Figure 17B:
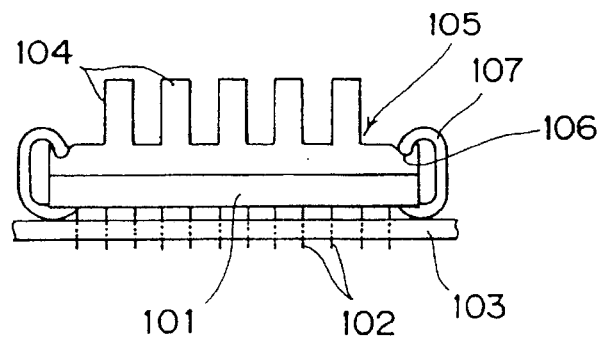

Also according to the present embodiment, similarly as in the case according to the first embodiment of FIG. 1, efficient heat radiation of the integrated circuit package 21 becomes possible, and facilitation of a mounting operation of the heat sink 50 is allowed. While the outer periphery of the integrated circuit package 21 in the present embodiment is substantially equal to the outer periphery of the frame portion 31A of the guide member 31, the spirit of the present embodiment can be applied also to another case wherein the outer periphery of the integrated circuit package 21 is greater than the outer periphery of the frame portion 31A. In the case according to the conventional example described with reference to FIGS. 17A and 17B, while it is necessary to use an integrated circuit package and a heat sink having the substantially same outer profiles since the integrated circuit package and the heat sink must necessarily be held at edge portions thereof by means of clips having a C-shaped section, since, in the present invention, a heat sink can be mounted irrespective of the outer profile of an integrated circuit as described above, the universality is enhanced.

Figure 4A:
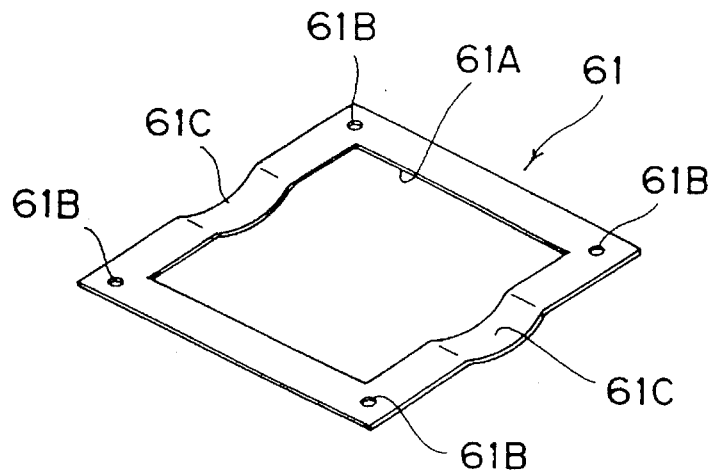
FIGS. 4A and 4B are perspective views showing another example of a cover which can be used in the embodiment of the present invention.
Figure 4B:
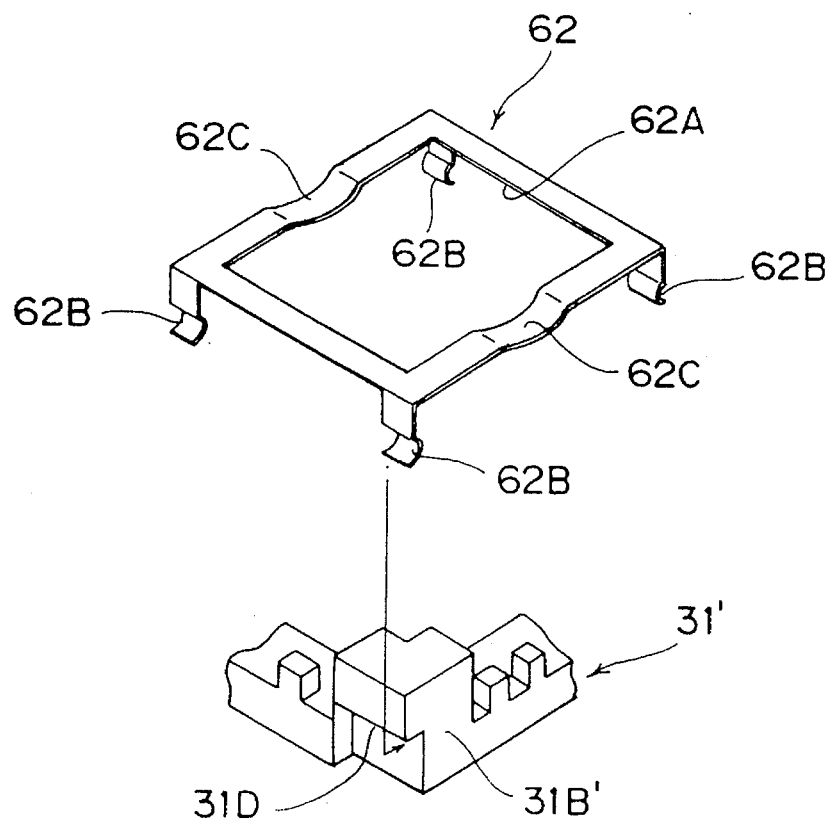

FIGS. 4A and 4B are views for explaining another covers which can be used in place of the cover 60 in the first embodiment of FIG. 1, the second embodiment of FIG. 3 and so forth. In the example whose perspective view is shown in FIG. 4A a cover 61 is formed from a resilient plate member. Reference character 61A denotes an opening for exposing a heat sink, and reference character 61B denotes a threaded hole for screwing the cover 61 to a support post of a guide member. In the present example, portions 61C corresponding to opposing two sides of the cover 61 have a shape curved toward the side of a heat sink (not shown), and when the cover 61 is screwed, for example, to the support post portions 30B of the guide member 30 in the embodiment of FIG. 1, a resilient restoring force of the curved portions 61C acts to press the heat sink 50 against the integrated circuit package 20. Accordingly, by using the cover 61 formed from a resilient plate member having such curved portions, when the shape and the dimensions of the heat sink 50 or the mounting height of the integrated circuit package 20 is dispersed due to the manufacturing technique, the heat sink 50 can always be in sufficient close contact with the integrated circuit package 20 irrespective of such dispersion, and it is possible to maintain a high heat radiation characteristic.

In the example whose perspective view is shown in FIG. 4B, a cover 62 is fixed to support post portions of a guide member not by screwing, but the cover 62 is fixed to a guide member 31' by forming arresting portions 31D of the shape of a depression on outer walls of support post portions 31B' of the guide member 31' and engaging pawls 62B of the cover 62 with the arresting portions 31D of the support post portions 31B'. Reference character 62A denotes an opening for exposing a heat sink, and 62C denotes a curved portion of the cover 62. The cover 62 is obtained by working a resilient plate member similarly as in the example of FIG. 4A. By providing such resiliently deformable pawls 62B integrally on the cover 62. mounting of the cover 62 onto the guide member 31' is facilitated. Further, it is easy to mount and dismount the cover 62 when a heat sink is to be exchanged.

Figure 5:
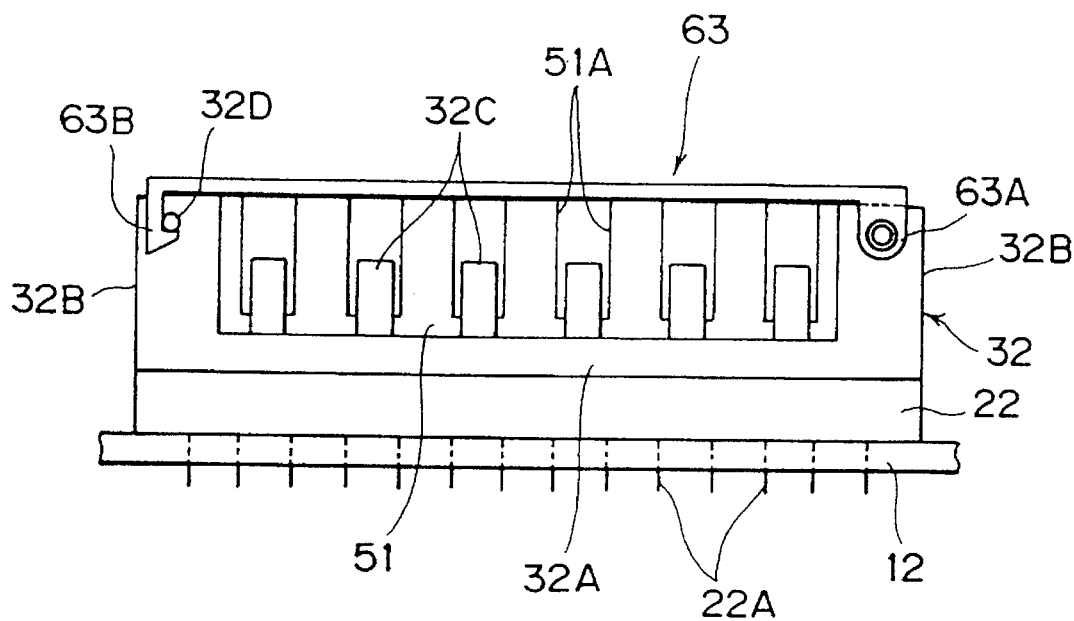
FIG. 5 is a side elevational view showing a further example of a cover which can be used in the embodiment of the present invention.

FIG. 5 is a side elevational view showing a further example of a cover which can be used in the first embodiment of FIG. 1, the second embodiment of FIG. 3 and so forth. The present cover is characterized, in contrast with the covers of the embodiments described so far, in that one end thereof is mounted for pivotal motion on a guide member. An integrated circuit package 22 is mounted on a printed circuit board 12 by means of pins 22A. Support post portions 32B of a guide member 32 protrude only in an upward direction from a frame portion 32A, and the guide member 32 is adhered at a lower face thereof to the integrated circuit package 22. An outer periphery of the integrated circuit package 22 is substantially equal to an outer periphery of the frame portion 32A of the guide member 32. Reference character 32C denotes a plurality of fin portions which protrude in the upward direction from the frame portion 32A of the guide member 32. In the present embodiment, a heat sink 51 having heat radiation fins 51A integrally thereon is used, and the heat sink 51 is pressed in the downward direction in FIG. 5 by a cover 6S so that a lower face thereof may be in close contact with an upper face of the integrated circuit package 22. One end 63A of the cover 6S is supported for pivotal motion on the support post portions 32B positioned on the right side in FIG. 5, and the other end 63B of the cover 63, which is shaped in a hook shape, is arrested at projections 32D provided on the support post portions 32B positioned on the left side in FIG. 5. According to the present embodiment, since establishment and cancellation of arresting engagement between the hook-shaped end portion 63B of the cover 63 and the projections 32D can be performed readily, replacement and so forth of the heat radiation fins 51A accommodated in the guide member 32 can be performed readily.

Figure 6:
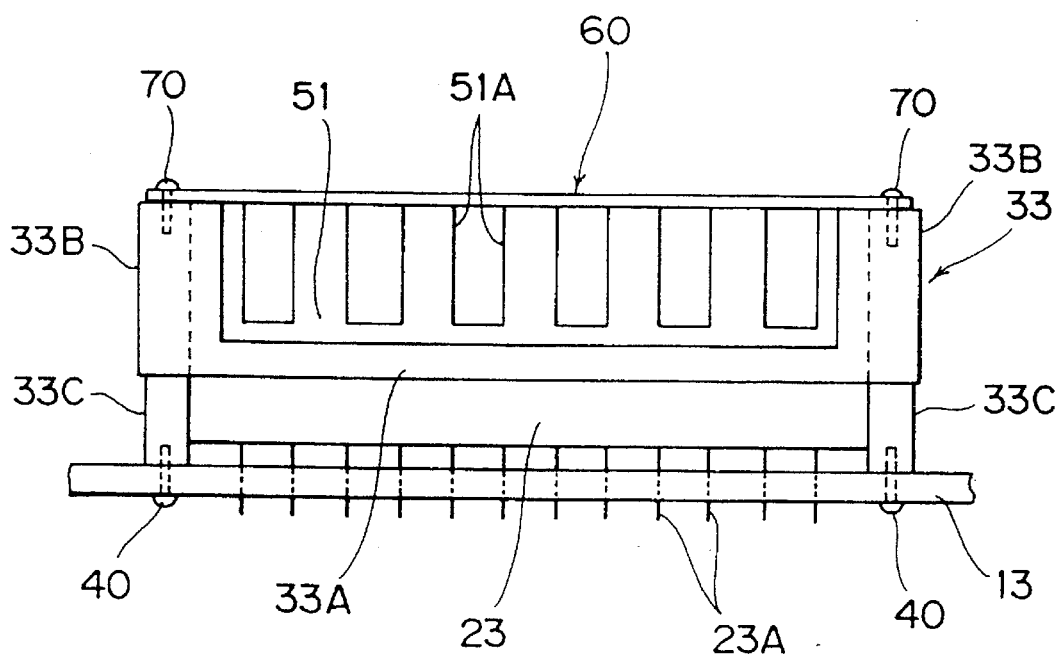
FIG. 6 is a side elevational view of a mounting structure for a heat sink showing a third embodiment of the present invention.

FIG. 6 is a side elevational view of a mounting structure for a heat sink showing a third embodiment of the present invention. The present embodiment is characterized, in contrast with the first embodiment of FIG. 1, in that part of support post portions of a guide member is formed as a separate member. An integrated circuit package 23 is mounted at pins 32A thereof on a printed circuit board 13. A guide member 33 having an inner periphery substantially equal to an outer periphery of the integrated circuit package 23 has a frame portion 33A and support post portions 33B which are formed integrally with each other, and pipe members 33C separate from them. In short, while in the embodiment of FIG. 1, the support post portions 30B of the guide member 30 are formed integrally with the frame portion 30A such that they protrude in the upward and downward directions, in the present embodiment, only portions (33B) of the support post portions which protrude in the upward direction are integrated with the frame member 33A, while the other portions (pipe members 33C) of the support post portions which protrude in the downward direction are separate members from the frame member 33A. Each of the pipe members 33C are fixed at a lower end thereof to a printed circuit board 13 by means of a screw 40, and an upper face of the pipe member 33C is fixed to a guide member body, for example, by adhesion. The guide member 33 and the integrated circuit package 23 may be fixed to each other by adhesion. Where part of the support post portions of the guide member is formed as a separate member as in the present embodiment, it is possible to cope with integrated circuit packages of various sizes and the universality is enhanced by employing such a construction, as shown in FIG. 6, for a comparatively small integrated circuit package but by employing, for a comparatively large integrated circuit package, such a construction as in the second embodiment of FIG. 3 without using a pipe member.

Figure 7:
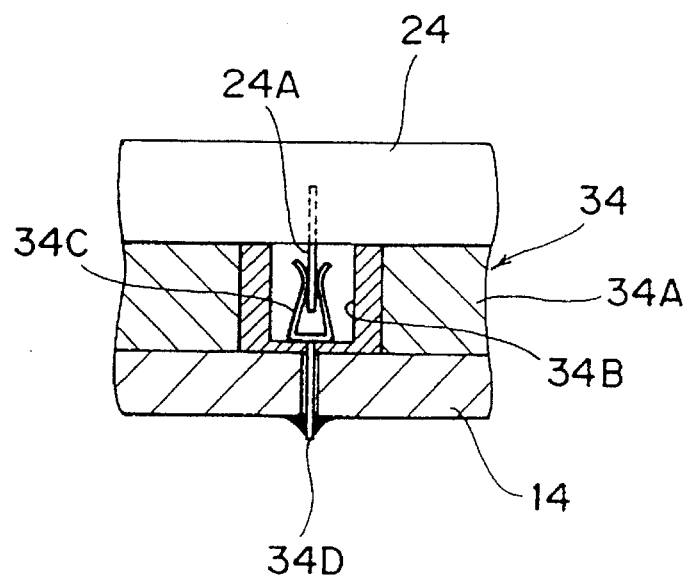
FIG. 7 is a partial sectional view of a mounting structure for a heat sink showing a fourth embodiment of the present invention.

FIG. 7 is a partial sectional view of a mounting structure for a heat sink showing a fourth embodiment of the present invention. The present embodiment is characterized, in contrast with the embodiments described so far, in that a guide member further has a socket structure for removably mounting a pin of an integrated circuit package. In the present embodiment, a guide member 34 is fixed directly to a printed circuit board 14 similarly as in the first embodiment of FIG. 1 and so forth, The guide member 34 has a heat radiation portion 34A made of a material having a high heat conductivity, such as aluminum, a plurality of socket chambers provided at a plurality of locations of the heat radiation portion 34A in a direction of a plane and each defined by an insulator 34B, such as a resin, a contact 34C provided in each of the socket chambers for fitting with a pin 24A of the printed circuit board 24, and a lead 34D connected to the contact 34C and mounted on the printed circuit board 14 by soldering or the like. By adopting such a socket structure, it can be made possible to mount and dismount the integrated circuit package 24 while assuring a heat radiation characteristic of the heat sink 34.

Figure 8:
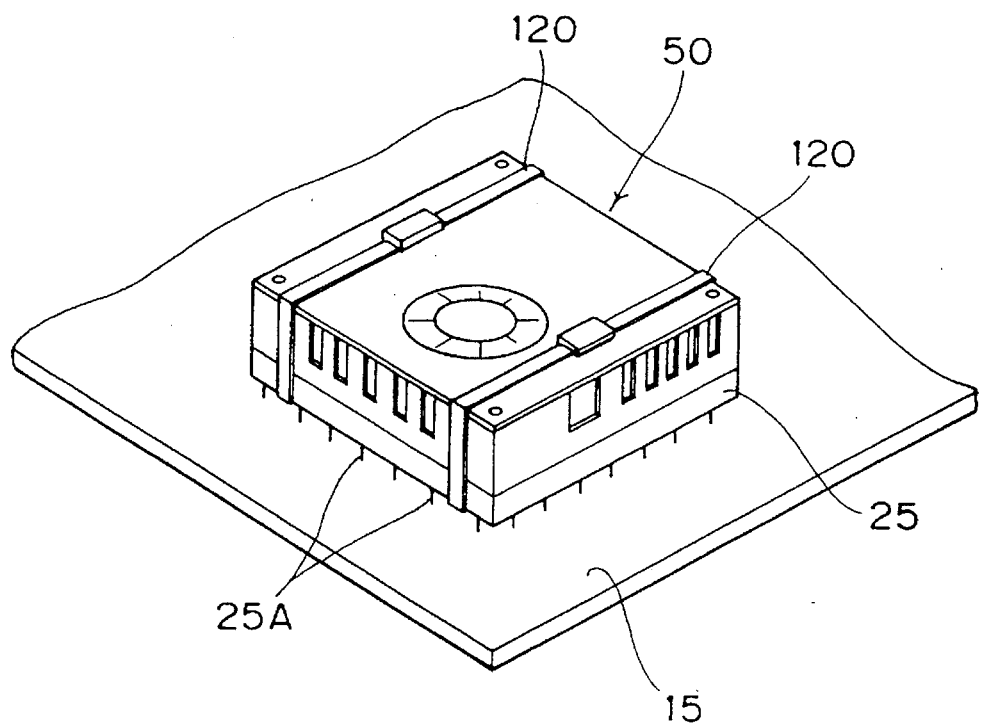
FIG. 8 is a perspective view of a yet further mounting structure for a heat sink showing a fifth embodiment of the present invention.

FIG. 8 is a perspective view of a mounting structure for a heat sink showing a fifth embodiment of the present invention. An integrated circuit package 25 mounted on a printed circuit board 15 has a plurality of pins 25A for electric connection, and each of the pins 25A are connected to a conductor pattern (not shown) formed on the front surface or the rear surface of the printed circuit board 15 by soldering. For example, a heat sink 50 shown in FIG. 2 is placed on the integrated circuit package 25 such that the bottom face thereof closely contacts with the upper face of the integrated circuit package 25.

In the present embodiment, the size of the bottom face of the heat sink 50 is substantially equal to the size of the upper face of the integrated circuit package 25.

In order to fix the heat sink 50 to the integrated circuit package 25, a belt member 120 is used. The belt member 120 is provided around the integrated circuit package 25 and the heat sink 50 through a gap between the printed circuit board 15 and the integrated circuit package 25. In the present embodiment, two belt members 120 are provided corresponding to the opposite ends of the heat sink 50.

FIGS. 9A and 9B are a side elevational view and a plan view showing an example of the belt member shown in FIG. 8. The belt member 120 has a belt body 122 in the form of a tapering belt made of, for example, nylon, and a head portion 124 provided integrally with the belt body 122 at an end portion of the belt body 122. An opening 128 into the inside of which an arresting pawl 126 extends is formed in the head portion 124. Meanwhile, the belt body 122 has a ratchet 130 formed thereon which engages the arresting pawl 126 when the belt body 122 is inserted from the tapering portion thereof into the opening 128 of the head portion 124. With the belt member 120 shown in FIGS. 9A and 9B, the shapes of the ratchet portion 130 and the arresting pawl 126 are set so that, when it is tried to insert the belt body 122 from the tapering portion thereof into the opening 128 of the head portion 124, it can be inserted readily in the insertion direction, but after the belt body 122 is inserted once, it cannot be pulled out any more.

Figure 10A:
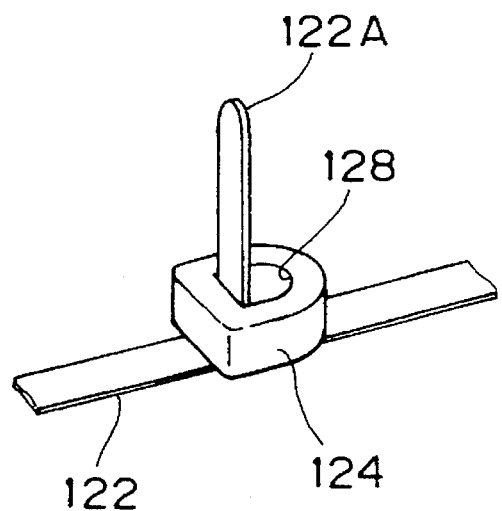
FIGS. 10A and 10B are perspective views of a latch portion of the belt member.
Figure 10B:
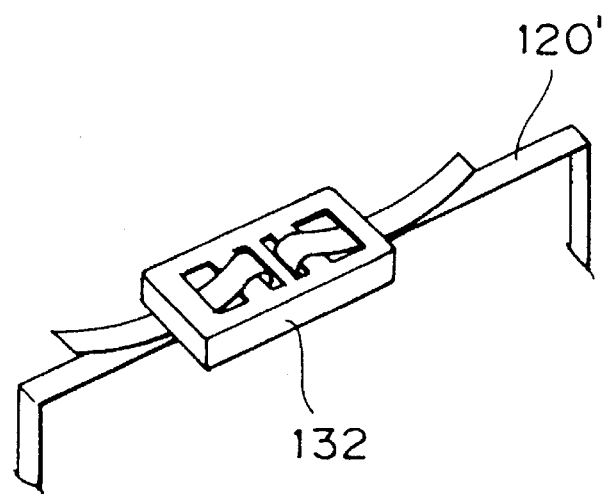

FIGS. 10A and 10B are perspective views of the latch portion of the belt member. FIG. 10A shows the latch portion in the case wherein the belt member of FIGS. 9A and 9B is employed, and in this instance, by pulling the tapering portion 122A of the belt body 122, which has been inserted into the opening 128 of the head portion 124 from the side of the heat sink 50, in an upward direction while the head portion 124 is pressed against the heat sink 50 of FIG. 8, the belt member 120 can be tightened to closely contact the heat sink 50 firmly with the integrated circuit package 25 in FIG. 8.

In another example shown in FIG. 10B, a belt member 120' made of a material having a uniform thickness and a uniform width and having a comparatively high surface friction is used, and the opposite ends of the belt member 120' are folded back using a latch member 132 having three rectangular holes in a longitudinal direction thereof to closely contact the heat sink 50 in FIG. 8 firmly with the integrated circuit package 25.

Since there is the possibility that the belt member touches with the pins 25A of the integrated circuit package 25 when it is threaded through the gap between the integrated circuit package 25 and the printed circuit board 15, preferably an insulator, such as nylon, is employed as a material of the belt member in order to prevent short-circuiting between the pins 25A. As a material of the belt member, it is also possible to employ a metal material, the surface of which is processed by insulation processing, such as by covering over the surface with a resin. Though not shown, a heat contracting tube may be employed for the belt member, and the heat sink 50 in FIG. 8 may be closely contacted firmly with the integrated circuit package 25 by heating the heat contracting tube to contract the same.

In the structure shown in FIG. 8, since the pins 25A cannot be formed very long from the point of view of the processing speed and so forth of the integrated circuit package 25, there is a limitation in the gap between the integrated circuit package 25 and the printed circuit board 15 through which the belt member 120 should be threaded. The gap between the integrated circuit package 25 and the printed circuit board 15 obtained due to the presence of a lid for the standoff formed on the pins 25A or for the airtight enclosure formed on the bottom face of the integrated circuit package 25 is 0.5 mm to the utmost. Meanwhile, with the belt member 120 shown, for example, in FIGS. 9A and 9B, the thickness of the belt body 122 can be set smaller than 0.5 mm from the point of view of the strength of the belt body 122, but when formation of the racket 130 on the belt body 122 is taken into consideration, the thickness of the belt body 122 cannot be set smaller than 1 mm. Thus, in the present embodiment, a portion of the belt body 122, which corresponds to the integrated circuit board 25, and on which the ratchet 130 need not be formed, is formed with a reduced thickness. At the opposite ends of the reduced thickness portion 122, slopes are provided on the belt 122 as shown in FIGS. 9A and 9B to prevent deterioration of the strength of the belt body 122. The opposite ends of the reduced thickness portion 122B may be formed by rounding processing in place of the slopes.

When the belt member having such reduced thickness portion is applied to the structure of FIG. 8, in the operation of mounting the integrated circuit package 25 onto the printed circuit board 15, the belt members are interposed between the integrated circuit package 25 and the printed circuit board 15. In this instance, since the reduced thickness portions 122B of the belt members correspond to the bottom face of the integrated circuit package 25, the belt members set once will not be pulled off from within the gap by mechanical vibrations or the like. Then, when the heat sink 50 is placed onto the integrated circuit package 25, the opposite ends of the belt members are latched, thereby completing mounting of the heat sink 50. In this manner, according to the present embodiment, by employing a belt member of a simple construction, the heat sink can be mounted onto the integrated circuit package 25 at a low cost and readily without particularly using any other part. Further, since the area over which the surface of the heat sink is covered is very small, an effective heat radiation action of the heat sink can be maintained.

By the way, where a belt member is formed from a resin such as nylon, the elongation of the reduced thickness portion is sometimes so great that the clamping force is not stable. On the other hand, when the belt member is used under a high temperature environment, the belt member likely undergoes elongation, which sometimes makes the mounting condition of a heat sink unstable. Thus, in a preferred embodiment of the present invention, the belt member is constituted from a resin belt (nylon belt) elongated beyond an elastic limit after molding thereof. Here, the elastic limit is a maximum stress a solid body can stand without undergoing permanent deformation. An example of a method of manufacturing such resin belt includes a step of forming a belt member of a desired profile by molding and another step of applying a predetermined tensile stress to the belt member. The belt member may be elongated while it is heated, for example, to 95° to 100° C. Further, in order to prevent deformation by moisture absorption during use, the belt member may be elongated in water boiling at 95° to 100° C. Where a belt member constituted from a resin belt elongated beyond its elastic limit in this manner is employed, the belt member is elongated little when or after a heat sink is mounted onto an integrated circuit package, and consequently, a stabilized clamping force can be obtained.

Recently, integrated circuit packages wherein the distance between pins is very small have been put into practical use, and such a flat belt member as shown in FIGS. 9A and 9B sometimes, cannot be used for such integrated circuit packages. This is because, where the width of the reduced thickness portion 122B is set smaller than the distance (for example, 0.8 mm) between pins of an integrated circuit package, a sufficient strength cannot be assured at the reduced thickness portion. In such an instance, the reduced thickness portion of the belt member should be formed with a cross section of a circular shape having the diameter of 0.4 to 0.5 mm. The belt member having the reduced thickness of the circular cross section can have a high strength when applied to an integrated circuit package of the same pin distance comparing with another belt member having a reduced thickness portion of a rectangular cross section. Or else, a slit may be formed in the reduced thickness portion 122B of the belt member in its longitudinal direction. When the belt member is to be used, pins of a small distance on an integrated circuit package are inserted into the slit. By this means, the belt member having the reduced thickness portion of a rectangular cross section of a great width can be adapted to an integrated circuit package of a small pin distance.

Figure 11A:
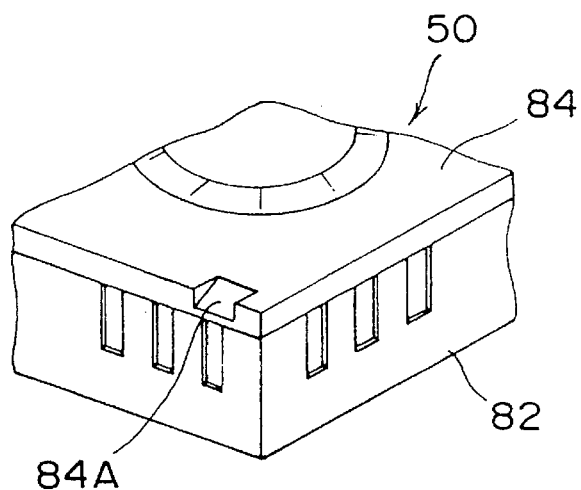
FIGS. 11A, 11B and 11C are perspective views showing a guide of a heat sink.
Figure 11B:
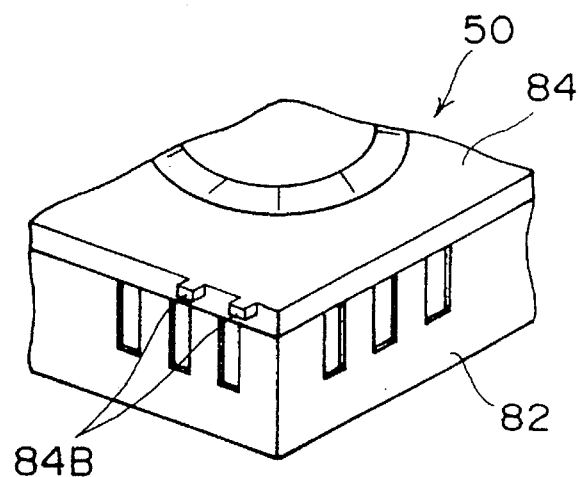
Figure 11C:
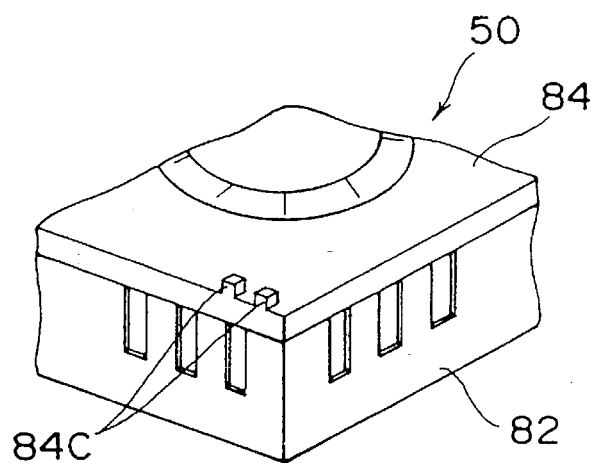

A guide may be provided on the heat sink as shown in FIGS. 11A, 11B and 11C in order to prevent stress concentration of the belt member upon its contacting portion with an upper face edge portion of the heat sink or prevent displacement of the belt member in its width-wise direction. In an example shown in FIG. 11A, a guide groove 84A is formed obliquely at an edge portion of a cover member 84 for a heat sink 50. Where such guide groove is formed, occurrence of stress concentration on the belt member can be prevented and besides displacement of the belt member in its widthwise direction can be prevented. In another example shown in FIG. 11B, two projection guides 84B are formed with a width corresponding to the width of a belt member at a side end of a cover member 84. Meanwhile, in a further example shown in FIG. 11C, projection guides 84C are provided uprightly at an edge portion of an upper face of a cover member 84. Where the projection guides shown in FIG. 11B or 11C are formed on the cover member 84, displacement of the belt member in its widthwise direction can be prevented. In FIGS. 11A, 11B and 11C, singe only part of a heat sink is shown, only one guide is shown, it is desirable to actually provide guides at two opposing locations on a single belt member. Further, taking the universality in use into consideration, a guide may be provided in advance at a location at which a belt member does not contact with the guide when the cover member is used.

Figure 12:
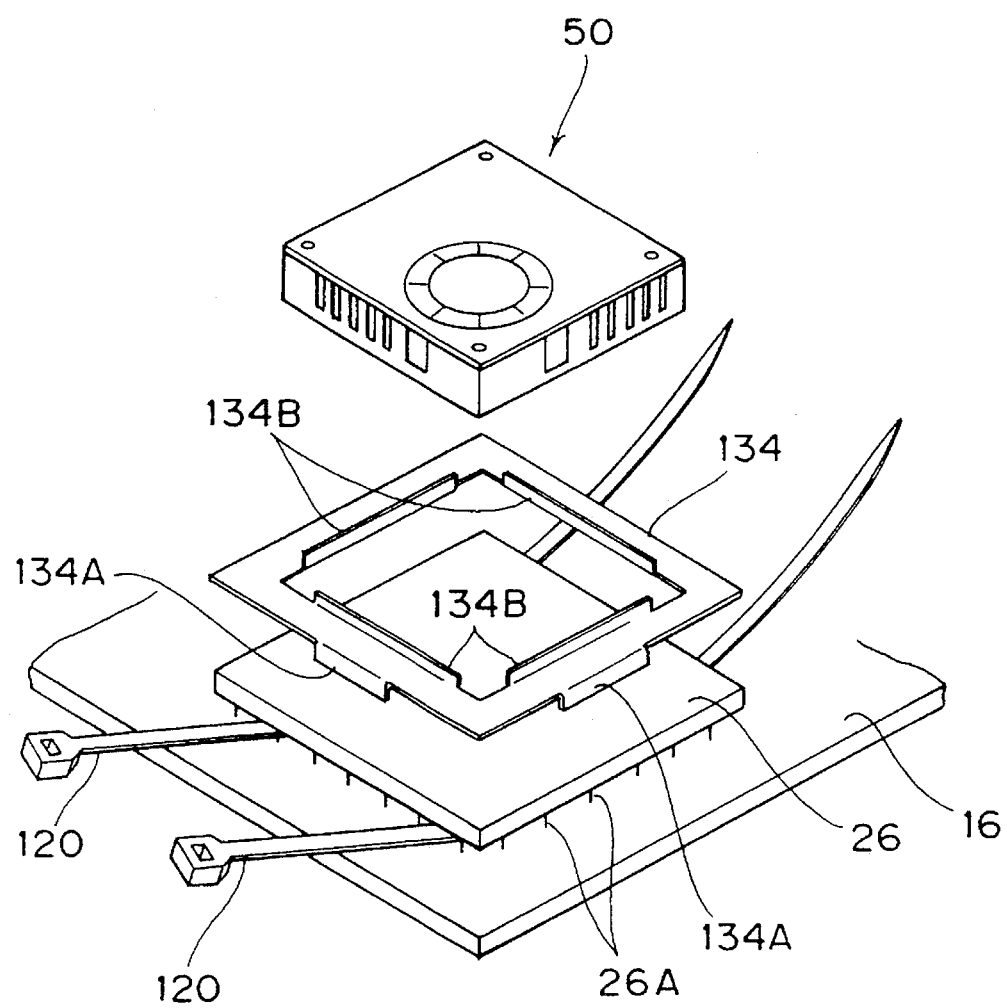
FIG. 12 is an exploded perspective view of the mounting structure for a heat sink showing the fifth embodiment of the present invention.

FIG. 12 is an exploded perspective view of a mounting structure for a heat sink showing a fifth embodiment of the present invention. An integrated circuit package 26 of a comparatively large size is mounted on a printed circuit board 16. Reference character 26A denotes a pin for connection of the integrated circuit package 26. When it is tried to mount a heat sink 50 of a comparatively small size onto such an integrated circuit package 26 of a comparatively large size as described above, the heat sink 50 cannot be fixed firmly only if a belt member is merely employed as in the fifth embodiment of FIG. 8. Therefore, in the present embodiment, a frame-shaped guide 134 seated on an upper face of the integrated circuit package 26 for arresting a lower portion of a side face of the heat sink 50 is employed.

The guide 134 has pawls 134A bent in a downward direction at four locations of an outer peripheral edge portion, and pawls 134B bent in an upward direction at four locations on an inner peripheral edge portion. The distance between mutually opposing ones of the pawls 134A corresponds to the width of the integrated circuit package 26, and the distance between mutually opposing ones of the pawls 134B corresponds to the width of the heat sink 50. Where settlement of The position of the heat sink 50 in a direction of its plane on the integrated circuit package 26 has been performed using such a guide member 134 as described above, by using, for example, such a belt member 120 as shown in FIGS. 9A and 9B, the heat sink 50 can be mounted firmly onto the integrated circuit package 26 which is greater in size than the heat sink 50.

Figure 13A:
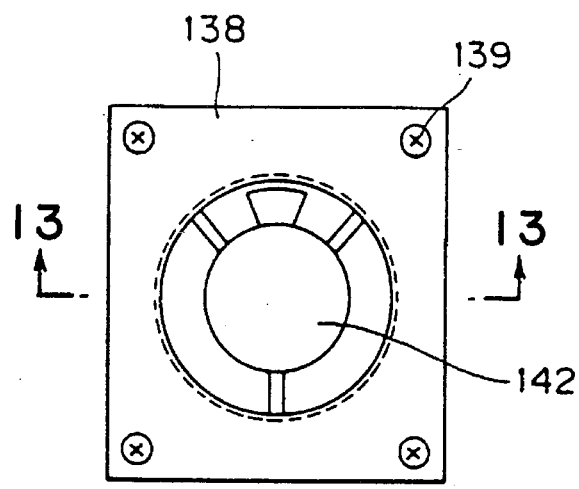
FIGS. 13A, 13B and 13C are views showing a first embodiment of a heat sink of the present invention.
Figure 13B:
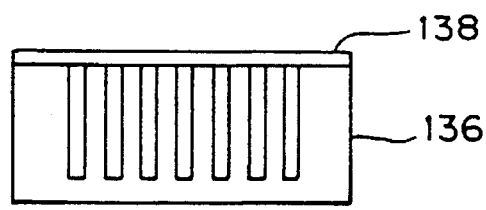
Figure 13C:
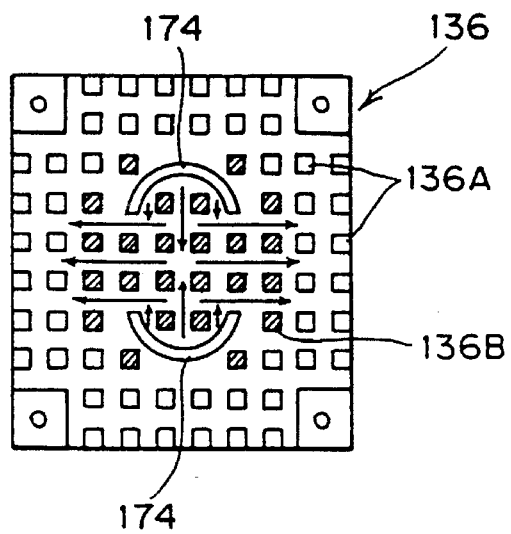
Figure 14:
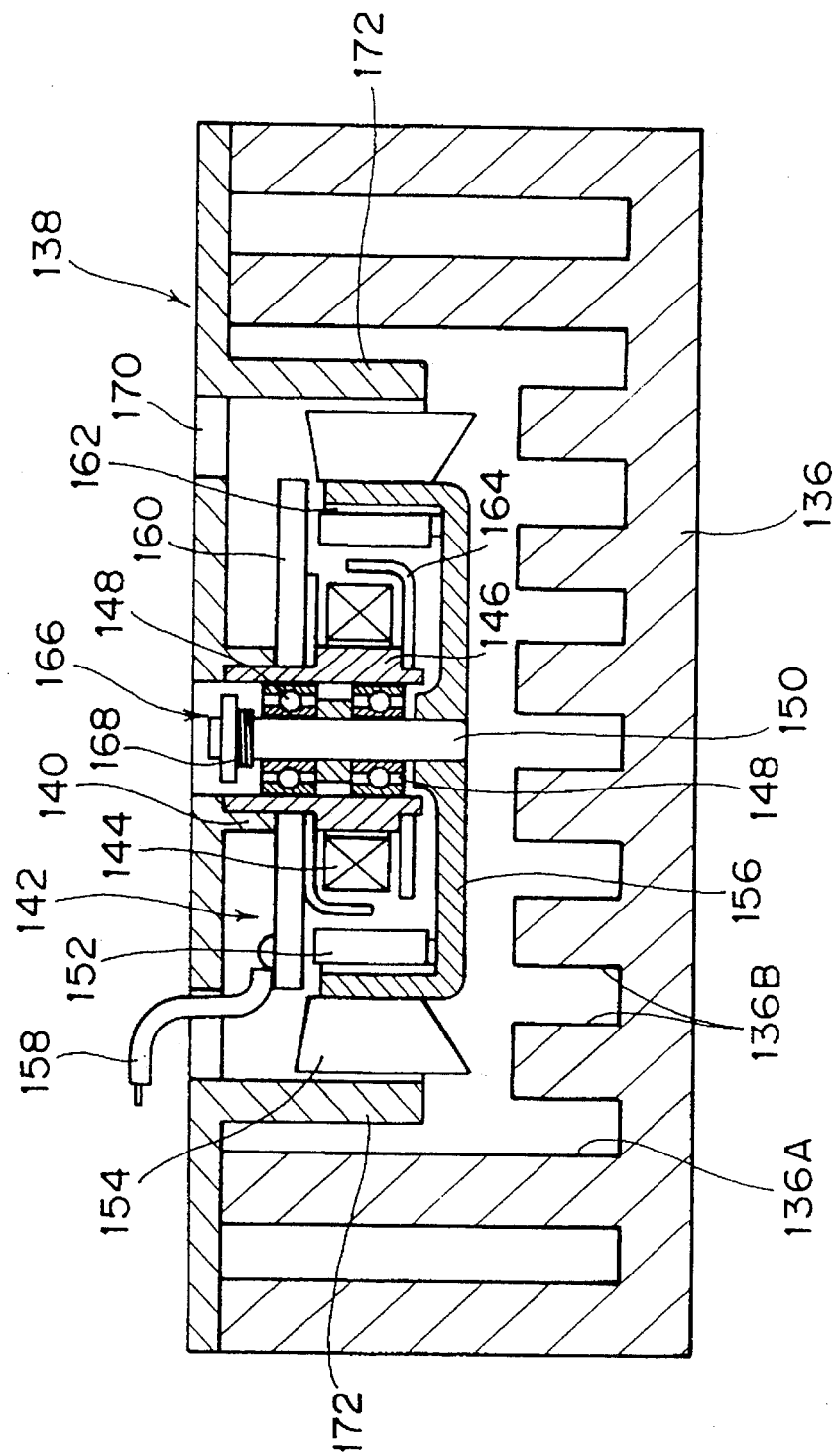
FIG. 14 is a sectional view taken along line 13—13.

Subsequently, several embodiments of a heat sink of the present invention which is high in cooling efficiency will be described. FIGS. 13A, 13B and 13C are views showing a first embodiment of the heat sink of the present invention. FIG. 13A is a plan view of the heat sink, FIG. 13B is a side elevational view of the heat sink, and FIG. 13C is a plan view of a base member of the heat sink. Further, FIG. 14 is a sectional view of the heat sink taken along line 13—13. The present heat sink has a base member 136 having a lower face closely contacted with an upper face of an integrated circuit package and an upper face from which a plurality of heat radiation fins 136A and 136B extend, and a cover 138 secured to the base member 136 for closing an upper portion of the base member 136 with screws 139. A fan mounting portion 140 is formed on the rear face of the cover 138, and a fan assembly 142 serving as an air blasting device is secured to the fan mounting portion 140.

The fan assembly 142 is constituted from a stator 146 force fitted in and secured to the fan mounting portion 140 and having a coil 144 provided on an outer peripheral portion thereof, a shaft 150 provided uprightly at the center of the stator 146 by way of a bearing 148, a rotor 156 secured to the shaft 150 and having a magnet 152 secured to an inner peripheral wall thereof and blades 154 secured to an outer peripheral wall thereof, and a printed circuit board 160 to which a lead 158 is connected. A motor driver circuit not shown is mounted on the printed circuit board 160. It is to be noted that, in FIG. 14, reference numeral 162 denotes a ring yoke, 164 a yoke, 166 a cut washer mounted on the shaft 150, and 168 a spring for biasing the shaft 150 upwardly. Meanwhile, reference numeral 170 denotes an opening provided in the cover 138 for allowing circulation of air therethrough, and 172 an annular projection for assurance of a static pressure difference. The opening 170 is provided by a plural number along a locus of rotation of the propeller 154.

In the present embodiment, the base member 136 and the fins 136A and 136B are formed as a unitary member from such a material that has a high heat radiation property, such as aluminum. Of those fins, the fins 136B at a portion corresponding to the fan assembly 142 are set shorter than the fins 136A at the other portion. Further, as shown in FIG. 13C, separators 174 constituted from portions of a cylinder which extend from the base member 136 along the locus of rotation of the blades 154 are provided on the base member 136. The separators 174 are formed integrally with the base member 136 similarly as the fins 136A and 136B.

By adopting the fins 136A and 136B and the separators 174 having the particular shapes and the particular arrangements in this manner, where the air blasting direction by the fan assembly 142 is set to a direction in which the air flows from the outside to the inside by way of the openings 170, such flows of wind as indicated by arrow marks in FIG. 13C can be obtained, and a very effective heat radiation characteristic can be obtained. While two kinds of long and short fins are employed in the present embodiment, fins of three or more kinds of lengths may be disposed. For example, where the length of fins at a central portion of a portion corresponding to a fan assembly was set to 3 mm, the length of fins at peripheral portions of the portion corresponding to the fan assembly was set to 8 mm and the length of the remaining fins was set to 18 mm, a very good heat radiation property was successfully obtained.

FIGS. 15A and 15B are views showing other examples of an arrangement of fins. In the example shown in FIG. 15A, a fin 136C just below the center of a fan assembly is formed so as to have a column-like shape so that wind may flow smoothly therearound. The height of the fin 136C is equal to the height of fins 136B. In the example shown in FIG. 15B, the sectional area of fins 136D just below the center of a fan assembly are made so small that wind may smoothly flow therethrough. Where there is a sufficient space for the arrangement of the fins, the distance between the fins may be increased so that wind may flow smoothly between them. Also in FIGS. 15A and 15B, arrow marks indicate flows of wind when the air blasting direction of the fan assembly is such that air is taken in at an upper face of a heat sink. The air blasting direction of the fan assembly may be set such that it may be a discharging direction at the upper face of the heat sink by reversing the direction of rotation of the motor or like means. Further the sectional shape of fins may be a round shape or a polygonal shape.

FIGS. 16A, 16B and 16C are views showing a second embodiment of the heat sink of the present invention. FIG. 16A is a plan view of the same, FIG. 16B a side elevational view of the same, and FIG. 16C a plan view of a base member of the same. In the present example, two fan assemblies 142 are provided on a cover 138, and corresponding to them, shorter fins 136B are disposed at predetermined positions as shown in FIG. 16C. Further, in order to prevent leakage of rain at a side face of a heat sink, shield plates 176 are provided on the opposite sides with respect to the two fan assemblies 142. The shield plates 176 are, for example, integral with a base member 136. Where a plurality of fan assemblies are involved in this manner, by providing a driver circuit and a power source for each of them, when one of the fan assemblies fails, a sudden rise of the temperature of device junctions of an integrated circuit package, which makes an object for cooling, can be prevented, and consequently, this contributes much to enhancement of the reliability of the apparatus.

As described so far, according to the present invention, an effect that provision of a mounting structure for a heat sink which is high in cooling efficiency and is easy to mount is possible is provided. Further, according to the present invention, there is another effect that provision of a heat sink having a high cooling efficiency is possible.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A heat sink, comprising:

a base member having a lower face adapted to be in contact with an upper face of an integrated circuit package and having an upper face from which a plurality of heat radiation fins extend;

an air blasting device including a motor having a rotary shaft and blades located around the rotary shaft, to blast air to said heat radiation fins of said base member, said air blasting device being disposed above a set of said plurality of heat radiation fins, a diameter of said air blasting device being substantially smaller than a width of said base member to provide a region between said air blasting device and an outer periphery of said base member, said set of said plurality of heat radiation fins located below said air blasting device being shorter than another set of said plurality of heat radiation fins located at a different position; and a cover having a lower face from which said air blasting device extends, said cover mounted to close an upper portion of said region between said air blasting device and said outer periphery of said base member.

2. A heat sink according to claim 1, further comprising at least a second said air blasting device.

3. A heat sink, comprising:

a base member having a lower face adapted to be in contact with an upper face of an integrated circuit package and having an upper face from which a plurality of heat radiation fins extend;

an air blasting device, including a motor having a rotary shaft and blades located around the rotary shaft, to blast air to said heat radiation fins of said base member, said air blasting device being disposed above a set of said plurality of heat radiation fins, a diameter of said air blasting device being substantially smaller than a width of said base member to provide a region between said air blasting device and an outer periphery of said base member, said set of said plurality of heat radiation fins located below said air blasting device being shorter than another set of said plurality of heat radiation fins located at a different position;

a cover having a lower face from which said air blasting device extends, said cover mounted to close an upper portion of said region between said air blasting device and said outer periphery of said base member; and a separator formed from a portion of a cylinder which extends from said upper face of said base member along a locus of rotation of said blades.

4. A heat sink according to claim 1, wherein said cover is mounted to top portions of said another set of said plurality of heat radiation fins.

* * * * *